United States Patent [19]

Criswell

[11] Patent Number: 5,168,501
[45] Date of Patent: Dec. 1, 1992

[54] METHOD FOR CHECKING HARDWARE ERRORS

[75] Inventor: Peter B. Criswell, Bethel, Minn.

[73] Assignee: Unisys Corporation, Blue Bell, Pa.

[21] Appl. No.: 475,637

[22] Filed: Feb. 6, 1990

[51] Int. Cl.[5] .................................. G06F 11/00
[52] U.S. Cl. .......................... 371/25.1; 371/22.3; 371/22.1
[58] Field of Search ............... 371/25.1, 22.1, 22.6, 371/22.3, 67.1

[56] References Cited

U.S. PATENT DOCUMENTS

| | | | |
|---|---|---|---|
| 4,879,717 | 11/1989 | Sauerwald et al. | 371/22.3 |
| 4,929,889 | 5/1990 | Seiler et al. | 371/25.1 X |
| 4,991,139 | 2/1991 | Takahashi et al. | 371/21.1 X |
| 4,996,691 | 2/1991 | Wilcox et al. | 371/25.1 |

Primary Examiner—Robert W. Beausoliel
Assistant Examiner—Allen M. Lo
Attorney, Agent, or Firm—John B. Sowell; Glenn W. Bowen; Mark T. Starr

[57] ABSTRACT

The present invention method is of the type which may be implemented in existing maintenance controllers of large mainframe computers and comprises a method for checking hardware errors which exists in the computing system and are displayable on a display of the type employed to display the state of scan settable latches. The novel method permits a more compact display of the functional operation of the computing system thus permitting a customer engineer to easily identify a faulty latch copy based solely on employing the method and prescribed format. The novel method includes assimilating the state of scannable logic devices such as latches and designators in the computer system and defining functionally the system in which they are located. The binary state of the individual latches are then subdivided into a plurality of one or more groups having the same number of copies and are assigned to a duplicate pseudo having four unique features which define each of the latches in a group. Each of the plurality of groups of latches are converted from their binary form to a code or code group which compacts the binary information and permits deviations of latches within the groups to be more easily detected. Means are provided for detecting errors within groups and for detecting the latch within the group in which the error occurs and for listing the duplicate latches that have failed with associated information which identifies their location.

10 Claims, 4 Drawing Sheets

FIG. 2

| DUPLICATE PSEUDO NAME (36) | NO. OF COPIES (37) | LEGAL DISP. CH (38) | CODE GROUP (39) | BINARY GROUPS (40) |
|---|---|---|---|---|
| A-02A | 2 | 0 OR 3 | 2 BITS OF OCTAL | 00 OR 11 |
| A-03B | 3 | 0 OR 7 | 3 BIT OCTAL | 000 OR 111 |
| A-04C | 4 | 0 OR F | HEXIDECIMAL | 0000 OR 1111 |
| A-05D | 5 | 00 OR 37 | OCTAL (5 BITS) | 00/000 OR 11/111 |
| A-06E | 6 | 00 OR 77 | OCTAL | 000/000 OR 111/111 |
| A-07F | 7 | 000 OR 177 | OCTAL (7 BITS) | 0/000/000 OR 1/111/111 |
| A-08G | 8 | 00 OR FF | HEXIDECIMAL | 0000/0000 OR 1111/1111 |
| A-09H | 9 | 000 OR 777 | OCTAL | 000/000/000 OR 111/111/111 |
| A-10I | 10 | 0000 OR 1777 | OCTAL (10 BITS) | 0/000/000/000 OR 1/111/111/111 |
| A-11J | 11 | 0000 OR 3777 | OCTAL (11 BITS) | 00/000/000/000 OR 11/111/111/111 |
| A-12K | 12 | 000 OR FFF | HEXIDECIMAL | 0000/0000/0000 OR 1111/1111/1111 |
| >12=X | 0's OR 7's<br>0's OR 1's<br>0's OR 3's | OCTAL (X BITS) | ──/000 OR ──/111<br>(LIMITED TO ONE GROUP OF X) |

FIG.4

| DUPLICATE PSEUDO NAME ~61 | DISPLAYED LEGAL GROUPS ~62 | BIT 5 ERROR ~63 | BINARY EQ ~64 |
|---|---|---|---|
| A-02A | 30300033303330033 | 2 | 10 |
| A-03B | 07700777707077 | 6 | 110 |
| A-04C | 000FF0FFFF00F | 4 | 0100 |
| A-05D | 37 00 37 00 37 37 | 2 | 10/000 |
| A-06E | 00 77 77 77 00 | 1 | 001 |
| A-07F | 177 000 177 | 5 | 101 |
| A-08G | 00 FF FF 00 FF FF | 4 | 0100 |
| A-09H | 000 777 777 000 | 1 | 001 |
| A-10I | 1777 0000 1777 | 5 | 101 |
| A-11J | 3777 0000 3777 0000 | 3 | 011 |
| A-12K | FFF 000 FFF FFF | B | 1011 |
| A-15X | 77777 | 6 | 110 |

METHOD FOR CHECKING HARDWARE ERRORS

BACKGROUND OF THE INVENTION

1. Field of the Invention

The present invention relates to a method of more rapidly and efficiently checking for errors in components of a high speed mainframe computer. More particularly the present invention relates to a method of examining latch scannable information stored in registers of a processor which are accessible by maintenance personnel at a maintenance controller.

2. Description of the Prior Art

Large mainframe computing systems usually comprise a plurality of cabinets which house major functional components or sections such as instruction processors (IPs), inputs/output processors (IOPs), system support processors (SSPs), main storage units (MSUs) as well as peripheral equipment and their associated controllers and a main maintenance controller (MMC). Such equipment having replicated component interconnected to form a mainframe computing system which may have hundreds of millions of switching elements in the form of logic circuits and registers. These logic circuits, switches and registers are usually operated at or near their maximum operating speeds. Over long periods of use these logic circuits, switches and registers may drift or malfunction and generate errors in the computing system.

It is a known technique to perform parity checks of the data being transferred to and from individual components on a mainframe computing system. When errors are detected in the data being transferred between components and sections within parts of the computing system, the components are isolated and taken off line by reconfiguration of the computing system to permit the source of the error to be found. It is relatively simple to determine that data and/or processing errors are occurring in the various parts of a mainframe computing system, however, the chore of identifying the exact source down to the section, which board and which integrated circuit chip and latch is causing errors is complex and time consuming.

Most modern large mainframe computers have check circuits and scan selectable latches or designators which may be accessed in a manner that permits the state of the latch or designator to be stored in registers or storage components. The information in the stored registers may then be checked and/or displayed. It is known that tens of thousands of such scan selectable latches and designators are built into large mainframe computers. These scan selectable latches and designators are usually arranged in strings and are accessed in a manner which associates each of the latches or designators with a unique identifier denoting the string and the relative position of the latch. The information so accessed may then be grouped in predetermined functional relationships which assist maintenance personnel in analyzing the state of the latches and switches of the computer system and identifying the location of the latch which has an error condition, thus, reducing down time.

A plurality of latches may be displayed in a group referred to as a "pseudo" which consists of an identifying pseudo name and a display of the values of the latches in the pseudo. For example, a register can be displayed under one pseudo name. Associated pseudos may be then grouped into a "panel" of values and displayed together on a maintenance controller oscilloscope. Within each pseudo display, each latch is assigned to a particular bit position in the pseudo word.

Not all latches or designators are singular indicative of a hardware problem. With the increased use of very large scale integration (VLSI) logic circuits, delay considerations related to data propagation times has become increasingly important. The same function or problem may be associated with a plurality of latches or designators, thus, there exists multiple copies (or duplicates) of the same functional latch in the selectable checking circuits. These multiple copies of the same functional latch replicated latch or designator present an entirely new problem concerning how to display them because their presence makes displaying the functional relationship between their unique name or designation and the state of the latch or designator more difficult. Heretofore, it had been preferred to keep multiple copies of the same functional latch on the same panel grouped together so that an error between copies could more easily be detected. As a result of this preference, fewer different functional registers or latches could be placed on a panel. A typical panel may include as few as 10 or as many as 30 unique names or designations depending on the number of columns and rows of information which may be concurrently displayed on, the same panel.

Heretofore, computer designers and circuit designers have applied unique names to latch scan information in a latch scan set such as arithmetic section to indicate the scanned information to be stored in a register for display was derived from a latch scan set somewhere in the arithmetic unit (ALU).

The present invention departs from the prior art practice of displaying all information concerning singular latches and provides a format, method and means for separating the multiple copies from a master functional display of the individual registers and further enhances the ability of service personnel to manually or automatically check the data being displayed on the panel for failure of errors depicted by one or more of the duplicate latches or designators.

SUMMARY OF THE INVENTION

It is a principal object of the present invention to provide a novel method and format for designating a duplicate pseudo which represents the identical values of duplicate latches.

It is a principal object of the present invention to provide a novel method and format for the designation of a master functional pseudo which reflects the functional use of all of the duplicate copies of the pseudo without the need to list duplicate pseudo bit designations.

It is a object of the present invention to provide a hardware format for a duplicate pseudo name or designation used for pseudos which will uniquely identify associated duplicate copy pseudos.

It is another object of the present invention to provide a hardware format for a duplicate copy pseudo designation that will define the number of duplicate copies in groups representative of latches or designators.

It is another object of the present invention to provide a flexible hardware format for describing a duplicate copy pseudo name or designation which contains information describing and identifying error conditions in the duplicate latches.

It is another object of the present invention to provide a flexible hardware format for a duplicate copy pseudo which indicates the contents of the duplicate copies of the master latch contained in the master functional pseudo.

It is yet another object of the present invention to display the state of all duplicate latches of associated pseudos in groups on a panel in a novel compacted format which enhances the manual or automatic detection of errors depicted by the state of individual scan settable latches or designators.

According to these and other objects of the present invention there is provided in a mainframe computing system scan selectable latches or designators which are operably connected to a maintenance controller and memory of the type adapted to display the state of the individual latches when placed in a scanning or diagnostic mode. Each latch or designator is provided with a unique identifier and may be included in a unique pseudo or name which contains at least four items of information as follows:

1. A functional character or characters indicating the section or component of the computing system where the latch is located, 2. A unique character which identifies that the pseudo contains groups of duplicate latches in a special format, 3. A plurality of characters which define the number of copies of the duplicate latches represented by each group within the pseudo, and 4. A plurality of suffix characters which make the duplicate pseudo name unique from all other pseudo names when there is more than one pseudo for latches with the same number of copies.

A duplicate copy pseudo is entered into the maintenance controller selected from one of the duplicate pseudo copies. The state of all of the duplicate latches associated with the duplicate pseudo is presented in groups and the groups are presented in a compacted and coded format. The compacted and coded format is selected so that there are only two correct legal characters representative of a group of characters available to indicate the state of the duplicate latches. Knowing the number of copies and the legal permissive characters representative of the state of the duplicate latches, visual examination of the display or automatic examination of the display information will identify the groups whose associated latches represent an error condition. The encoding format permits decoding to identify the particular latch having an error and is preferably selected to affect the maximum compaction or compression of the data being displayed. The format is selected so that no more than two unique codes are correct or legal, thus enhancing the ease of identifying the group and the latch representing an error state.

BRIEF DESCRIPTION OF THE DRAWINGS

FIG. 2 is a table showing a list of preferred embodiment duplicate pseudos and their associated legal permissive compacted characters for groups of copies;

FIG. 4 is a table showing a typical display format for groups representative of a plurality of scannable latches and the change of format which would occur if a bit 5 (the sixth bit) error was present in one of the latches.

DETAILED DESCRIPTION OF THE PREFERRED EMBODIMENT

Before explaining the figures in detail, it should be explained that in addition to scan settable latches most modern mainframe computers also contain solid state devices which may be scanned to indicate conditions at parts of the computer which are also important to the examination of duplicate latches. Further, parity conditions may also be incorporated into groups representative of duplicate latches to further enhance the ability to identify components and parts of a computer system which generate error conditions.

Further, in formatting the information representative of the latches and designators the following eight rules are preferably employed.

1. Give all latches a pseudo name and an assigned bit position in the pseudo.

2. If the latch or designator has a duplicate, then include the duplicate in the duplicate pseudo name.

3. When duplicate latches occur, select one as the master copy latch and list the non-master copies that are functionally related in association with the master copy latch. Include the master latch in both the functional pseudo and the duplicate pseudo.

4. Format the duplicate copy pseudo so that it represents all of the identical values in a group of adjacent duplicate copy pseudo bits. The master latch is assigned to the first bit in the group.

5. Each of the duplicate copies associated with a duplicate copy pseudo will have a unique identifying designation represented by its position in the group.

6. The groups contained within a duplicate pseudo do not require any functional relationship.

7. The term replicate logic or duplicate copy latches refers to groups of scannable latches that logically represent the condition of one functional latch.

8. Replicated parity bits are not recalculated, however, the main parity bit, if copied, may be included in a group indicative of the condition or state of the latches.

9. In examining for errors compare groups and detect the group that contains an illegal character and by correlation the latch(es) that is (are) different is assumed to be the pseudo bits containing the error, thus, the more bits in a group, the greater the ability to detect correlation errors.

10. When the legal display for any group containing an error is expanded to its binary equivalent it reveals the bit position or the latch that is different the other duplicate copies.

From the above step and rules it will now be understood that the task of formatting and identifying duplicate latches is best accomplish at the design lever by the computer designers, the circuit designers or persons assigned the formatting task in the design group.

Figure 1:
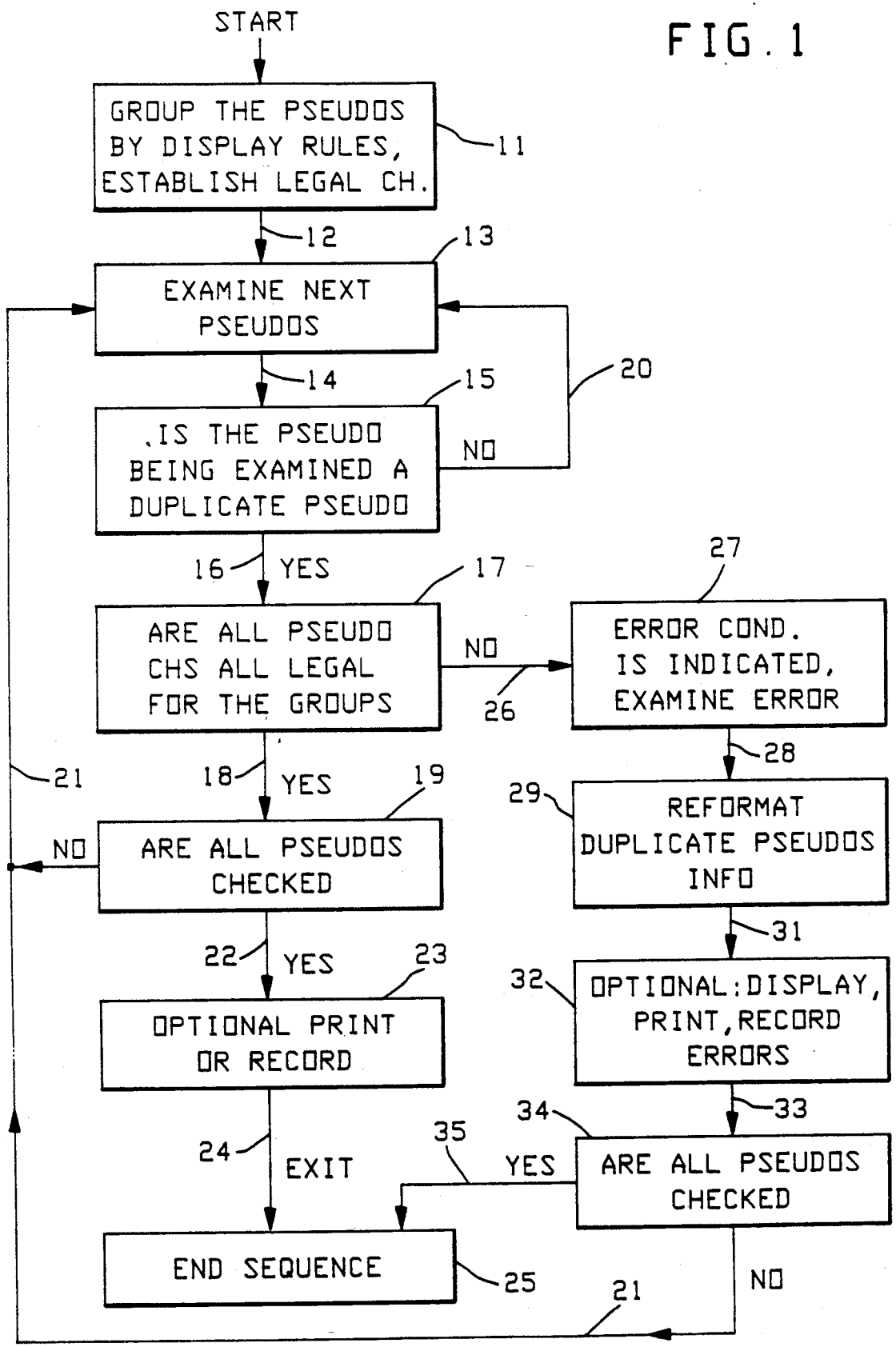
FIG. 1 is a basic flow diagram showing the logic steps which may be employed in a preferred embodiment method of checking for errors.

Refer now to FIG. 1 showing the logic steps employed in a preferred embodiment of the present invention method of checking for errors. Assuming that the previous rules and procedures have already taken place, the method begins with block 11 wherein the associated latches and their pseudos are grouped by the display rules so that selected as the master pseudo and the other legal characters for the groups may be generated. This information is available on bus 12 so that the next pseudo and its associated information may be provided to block 13 which acts as a holding registers for the information to be examined. The information in block 13 is available via bus to block 15 where the pseudo is examined to determine if one of the unique characters identifies the pseudo as a duplicate pseudo. If the pseudo under examination in block is not a duplicate pseudo, the sequence exits on line 20 and causes a new or next pseudo to be provided to block 15 for examination. When a duplicate pseudo is available the information on line 16 permits an examination in block 17 to determine if the group of duplicate pseudo bits is in a legal or permissible format. If the comparison is permissible the sequence exits on line 18 and makes a determination in block 19 whether if all of the pseudos have been checked. This permits the automatic checking of pseudos as distinguished from a visual check. If all of the pseudos have not been checked the sequence exits on line 21 and causes block 13 to be activated and the next pseudo is entered into the method sequence. Had all of the duplicate pseudos been examined the sequence would have exited on line 22 to block 23 to permit an optional printout or recording of the information of the duplicate pseudos. After completing the information programmed in software or hardware in block 23 the sequence exits on line 24 where logic block 25 can complete the end sequence.

If the code for a group of pseudo bits does not compare with a legal permissive code for a group the logic sequence exits on line 26 where logic block 27 makes the determination that an error condition is indicated and the type of error may be examined. In order to examine the type of error the information provided on line 28 is preferably reformatted so as to determine the individual latch or designator within the group which has generated the error condition in block 29. At this point it will be noted that provision must be made for recording all of the coded characters for all of the groups as well as providing information indicative of the legal permissive groups. The information on line 31 is indicative of a particular latch or designator which is different from other latches or designators presumed to be correct and this latch has an associated unique identifier which now may be displayed on the display panel, printed out and/or recorded in a memory bank for future use in logic block 32. Since error conditions must be sequentially observed, it is possible to accumulate all of the information regarding errors before performing the functions shown in logic block 32 or to perform them sequentially in real time in which case it is necessary to indicate that a sequential examination is being undertaken on line 33 and the same determination made in block 19 is made in logic block 34 to determine if all pseudos indicative of duplicate pseudos have been checked. If not, the logic exits on line 21 and takes the next pseudo employing the logic in block 13. However, if all pseudos have been checked and logged, the sequence exits on line 35 and completes the end sequence routine in logic block 25. The flow diagram of FIG. 1 is a basic or general diagram intended to illustrate the steps in their logical order of sequence that take place and is not intended as a detailed description of how hardware or software would be implemented to perform the individual steps shown.

Refer now to FIG. 2 showing a table and a list of preferred embodiment duplicate pseudos and their associated binary groups indicative of individual latches or designators within groups. In the preferred embodiment of the present invention, column 36 shows a listing of formatted duplicate pseudos in which the first row has the duplicate pseudo A-02A. The first A in the master pseudo is indicative of the functional section of the computer or processor such as the arithmetic section in which the latches and designators that are functionally related as duplicates are to be found. The second character is a dash "-" which indicates that the pseudo being read or examined is a duplicate pseudo. The next two characters, the 02 are indicative of the number of copies which will be found in the groups of duplicate pseudos which accompany the master pseudo as will be explained hereinafter. The last character A is indicative of the character or character positions which may be employed as a suffix to the master pseudo name to make the pseudo name unique from all others when there are more than one master pseudo being used for latches with the same number of copies. Column 37 entitled number of copies indicates the number of copies of latches which are combined within each group associated with the master pseudo shown in column 36. When the number of copies is in excess of 12 as indicated in the last row only one group will be associated with the duplicate pseudo. The legal permissive characters for this single group will depend on the number of copies X included in the group. For example, if the number X is equal to 15 it is possible to use an octal representation or character with five sevens (7). If the number of copies is not divisible by 3 or 4 the hexadecimal or octal encoding will require a truncation or shorting of the bit positions in the lowest order reading from left to right.

Columns 38 to 40 may now be explained with reference to the first row wherein the duplicate pseudo indicates that there are two copies of latch or designator information (including the master copy) in a group. Since the binary state of two latches may be presented by either 00 or 11 and binary notations as shown in column 40, this same information may be represented by a 0 or 3 when truncating the lowest order of a 3 bit octal group. Explained differently, the binary equivalent of 0 in octal is 000 however in the present case since only two copies are required the binary equivalent may be truncated and the binary equivalent of zero and three and octal may be represented by 00 and 11 representively. Row two shows a master pseudo A-03B indicating that three copies will be presented in the groups representing the latches or designators. If all three latches are in a one state the binary equivalent of 111 in three bit octal is 7 and the octal equivalent of 3 zeroes is still zero. Thus, it is possible to compress or compact the binary group representation of latches shown in column 40 to one of the legal permitted characters in octal as shown in column 38. The third row showing a master pseudo designation A-04C indicated that four copies can be legally shown by single character representations zero or F when coded in hexadecimal code representation. The character F in hexadecimal is indicative of four ones in binary representation as shown in column 40. The fourth row shows a master pseudo A-05D which designates five copies in a group that may be compacted or compressed using a full three bit binary group which in octal representation is 7. If the lowest order bit is truncated from a three bit binary representation and converted into octal the octal character is 3 rather than 7. Thus, the code group is shown in octal (5 bits) and the legal permitted characters for latches in a zero or one state are either 00 or 37 in truncated five bit octal. Similarly, the legal permitted characters for 6 to 12 bits may be converted from their binary group shown in column 40 to octal, truncated octal or hexadecimal as shown in columns 38 and 39. When the number of copies X exceeds 12 it is preferred to use an octal representation and truncate the lowest order 3 binary equivalent bits in the lowest order. It will be noted that the encoding to provide legal characters employs a simplistic approach which may be visually inspected to determine if the permitted legal characters shown in column 38 are generated by the actual position of the latches which will appear in the associated groups in the duplicate pseudo format.

Before explaining the ease with which the present format encoding permits error correction and error checking of improper latch and designator states for duplicate copies of latches and designators, it will now be explained with reference to FIG. 3 how the logic steps may be arranged to automatically check and identify errors. Before automatically checking the information in groups associated with the duplicate copy pseudo shown in column 36, the duplicate pseudo is presented on line 41 to the logic block 42. Block 42 generates the legal permitted characters shown in column 38 which are representative of the groups associated with the duplicate pseudos. The legal characters are presented on line 43 along with the coded character for the actual group on line 44 to be compared in logic block 45 to determine if the actual group being considered is a permitted legal group. If the group under consideration is by definition a legal permitted group then the codes compare as noted at logic block 46 and a determination is now made at logic block 47 to determine if all duplicate groups have been checked. If so, the signal on line 48 may be employed at logic block 49 to determine if any group errors existed. If there were no group errors and all duplicate groups had been checked the sequence may be ended as shown at logic block 51. However, if errors did exist then the errors should be printed out or recorded using the error format at logic block 52 before ending the sequence at logic block 51 via line 53.

If the comparison of codes at logic block 45 indicated that the group code representative of latches did not agree with a legal code the sequence would proceed via line 54 to logic block 55 indicating that the codes did not compare. Logic block 56 indicates the error condition. At this point in the sequence it is possible to print out the error conditions as they are detected at logic block 52 or to accumulate all of the errors until a signal on line 48 indicates that all duplicate groups have been checked and the accumulate comparisons may be printed out whether or not error conditions existed.

When all of the duplicate groups have not been checked, a signal on line 57 to logic block 58 causes the next group associated with the master pseudo to be presented to logic block 59 which again creates an actual code for the next group of duplicate latches associated with the master pseudo. If all of the latches in the next group are without error then a legal code will be generated on line 44 which compares with the legal code for the number of copies in a duplicate group on line 43. The sequence explained heretofore is repeated until all duplicate groups are checked and the logic no longer exits via line 57 to examine another duplicate code group.

Figure 3:
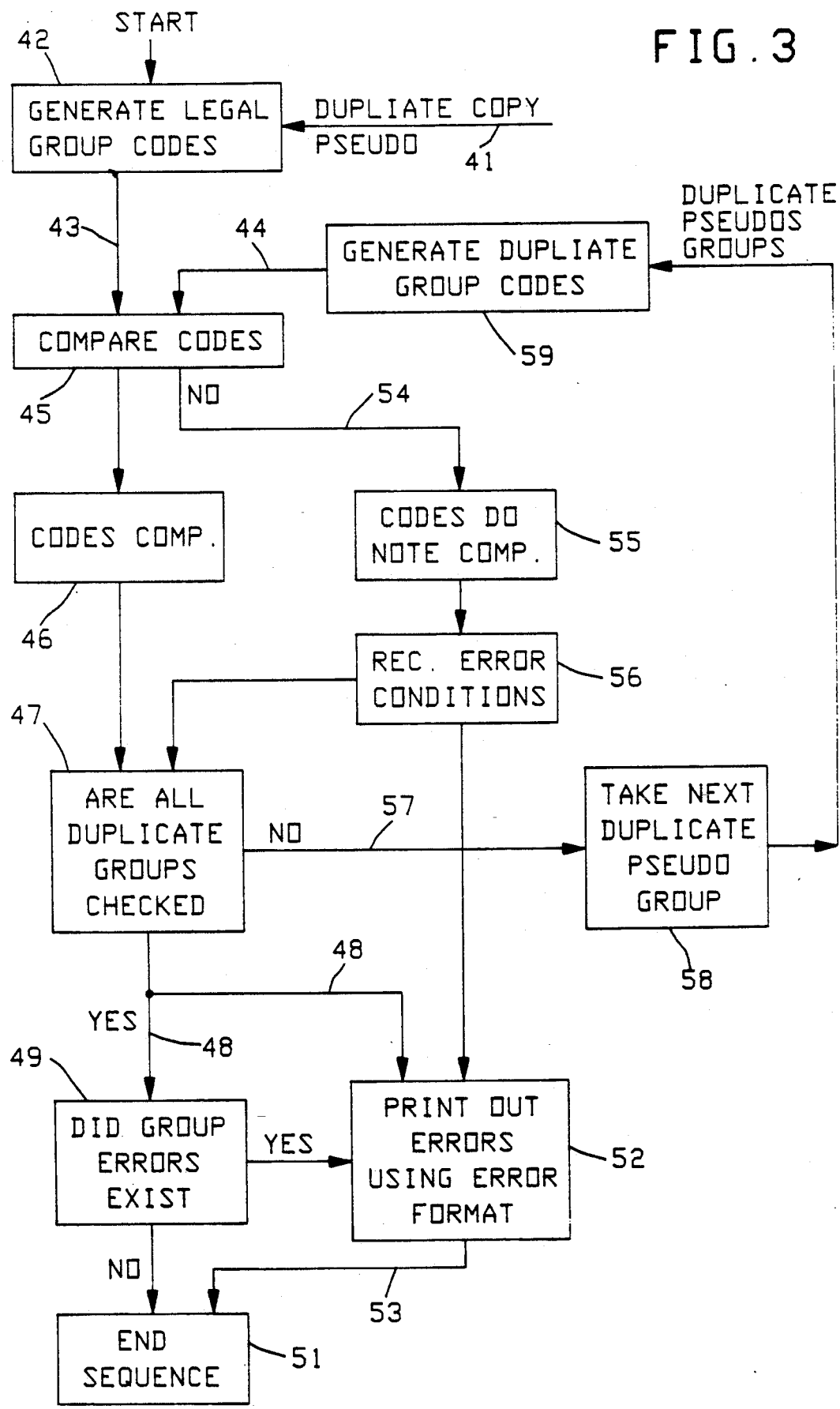
FIG. 3 is a basic flow diagram showing logic steps which may be employed to automatically check for and identify errors.

Refer now to FIG. 4 showing a table of a typical display format of the type examined in FIGS. 1 and 3. The duplicate pseudo names shown in column 36 of FIG. 2 are again present in column 61. In FIG. 4 the associated groups of latches or designators have been encoded and are shown as displayed groups in column 62. Opposite master pseudo A-02A there are shown 18 characters of displayed groups. Since there are two copies in each group there are 36 latches represented in the 18 associated groups shown in row one. The first bit of each group in this case bit 0, 2, 4, 6, 8—34, are the master bits for each group and is employed in the preferred embodiment of the present invention to represent the latch associated with the master functional pseudo. The 18 groups are not required to have any functional relationshi with each other and this allows the most compact display of the latches or designators with two copies or more. Similarly, in row five the master pseudo is shown as A-06E with five associated groups either 00 or 77 displayed as le9al groups in column 62. Each group represents six copies of latches or designators in which the lowest order bit of the group represents the master latch for each group associated with the master pseudo.

Assume now for purposes of explanation that an error occurs at bit five (which is the sixth bit position starting from zero). The group in which bit five occurs is underlined for each of the displayed legal groups shown in column 62. Explained differently,if there is an error in the groups associated with the duplicate pseudo A-02A in the bit five position it will occur in the third group as shown by the underlined three in the associated 18 groups of two bit octal encoded values. As explained with reference to FIG. 2 the underlined three in two bit octal is representative of a 11 in two bit octal and if bit 5 in the zero to five sequence is in error it is a zero as indicated at the binary equivalent in column 64. When the diagnostic hardware reads the third group, instead of reading an octal three it will read "10" in binary as an octal 2, thus the underlined three in the displayed groups of column 62 would have a 2 in place of the 3. Knowing that only zeros and threes are legal permitted characters for groups, the two is obviously an error and may be easily detected visually or automatically detected by entering the legal characters in one side of a comparator and the actual generated characters for the duplicate groups in the other side of the comparator. When the comparator indicates that the character being read is not a legal permitted character an error condition is generated as was explained with reference to FIGS. 1 and 3.

In similar manner if a bit five error occurs at the associated groups to master pseudo A-06E it will appear in the group represented in octal values by the second zero underlined in the first group. The latches should all be zeros and if the fifth bit is a one instead of a zero, the binary equivalent for this error is shown as 001 in column 64 which is encoded in octal values as a "1". Thus, instead of a legal permitted character 00 the error condition would appear on the display as 01.

To further illustrate how the proper legal characters for groups would be displayed if an error occurred at the bit five position the group in which the character change would occur is shown underlined in column and the binary equivalent for the error condition is shown in column 64 and the change resulting from the underlined character in column 62 appears in column 63. The first group associated with the pseudo A-12K should be a legal FFF but appear as a FBF if there were a bit error in the bit five position. It is apparent that B in hexadecimal coding is equivalent to 1011 in binary.

Having explained a general and basic case for generating legal characters representative of groups it will now be apparent that a software-hardware check may be made of all of the duplicate groups and any group which does not compare with a legal group or each other is suspect of containing an error. It is obvious that the error condition may be isolated to a particular latch and the unique identifier associated with the unique latch may be printed out as having an error condition. The format and coding employed for printing out the individual latches which contain errors preferably employs a pseudo name indicating the section in which the duplicate latch occurs as well as the component and the chip location and the actual value of the latch read as an error condition.

Having explained a preferred embodiment and a modification of the present invention it will be noted that the groups associated with each of the duplicate pseudos shown in column 36 of FIG. 2 may be presented for examination in binary group form as shown in column 40. However, it will also be noted that it is much more difficult to determine the errors in a latch position because a greater number of characters must be examined to determine that one of the latches in a group does not agree with the majority of the other latches in a group. It is much easier to examine three alphanumerical characters in a group than it is to examine or attempt to compare twelve binary bit positions. Further, it is much easier to implement the hardware and software for comparing three characters to determine if they are proper legal characters rather than to compare twelve bit positions. For example FFF can be compared with FFF using three parallel character comparators whereas a proper comparison of twelve binary bits would require more hardware or software as the case may be. In addition to simplifying automatic hardware and software which can examine every duplicate latch by groups in a mainframe computer in a short period of time, the formatting and encoding of groups further permits a printing out or displaying of individual latch information in a manner which indicates where errors have occurred, thus, enabling maintenance personnel to rapidly isolate a particular chip on a particular board within a particular section of a particular component in a very short period of time.

What is claimed is:

1. A method for displaying replicate data assembled from scannable logic devices, comprising the steps of:
    storing the binary state of binary data associated with a plurality of replicated logic devices to be examined for errors,
    grouping the binary data associated with the logic devices into one or more groups each being representative of a predetermined number of different replicated logic devices,
    assigning a pseudo identification to one logic device to be examined which is common to all of the replicated logic devices in a group,
    establishing designations for permissible groups of data,
    comparing said groups of binary data to determine differences between said groups of binary data and permissible groups to determine if error conditions exist among groups of binary data, and
    recording for dispaly said differences between groups of binary data.

2. A method for displaying replicated data as set forth in claim 1 wherein said step of recording for display further includes the steps of:
    physically displaying said pseudo identification as a duplicate pseudo identification, and
    displaying with said pseudo duplicate identification said groups of binary data representative of a predetermined said groups of binary data representative of a predetermined value of different replicated logic devices to permit inspection of said groups for errors.

3. A method for displaying replicated data as set forth in claim 2 which further includes the steps of:
    a binary number for each group representative of a permissible group, and
    determining that an error condition exists when any group of binary data differs from a permissible group.

4. A method for displaying replicated data as set forth in claim 3 wherein the step of establishing a binary number includes the step of establishing a plurality of legal groups of binary data.

5. A method for displaying replicated data as set forth in claim 1 which further includes the steps of:
    establishing a predetermined number of logic devices to be included in a group of binary data,
    establishing a compacted data format representative of permitted groups of said binary data, and wherein
    the step of comparing said groups of binary data comprises the step of comparing said compacted permitted groups with groups of said binary data in compacted format to determine if differences exist indicative of error conditions.

6. A method for displaying replicated data as set forth in claim 5 which further includes the steps of:
    displaying said groups of said binary data in compacted format to enhance the ability to determine differences between groups.

7. A method for displaying replicated data as set forth in claim 5 which further includes the steps of:
    determining the group of binary data which contains an error condition,
    determining the logic device within said group which contains an error condition, and
    displaying unique location identifying information associated with the logic device which contains the error condition.

8. A method for diagnosing error conditions and duplicate scannable logic devices, comprising the steps of:
    scanning said duplicate scannable logic devices,
    storing the logic binary state of binary data of said logic devices as data along with location identifying information,
    assimilating said binary data of said duplicate logic devices by some common function to be examined,
    dividing said assimilated binary data into groups of predetermined size to provide a plurality of gorups of duplicate data,
    providing one or more compacted designated codes representative of correct groups of duplicate data,
    compacting said groups of duplicate data by the same encoding rules applied to said compacted designated codes,
    comparing said encoded compacted groups of duplicate data with said compacted designated codes to determine differences indicative of error conditions, and recording in machine readable format for display said differences.

9. A method for diagnosing error conditions as set forth in claim 8 wherein the step of compacting said groups of duplicate data comprises selecting a code having a Radix of 8 or 16.

10. A method of checking a plurality of copies of duplicated binary information which are intended to be identical, comprising:

(a) determining te number of copies of said binary information and providing number codes that have available a plurality of bits representative thereof, wherein said number codes are provided in coded formats that are dependent upon said number of copies, and said coded formats provide groups of said bits which must contain either all "0" bits or all "1" bits to be permissible, (b) providing a plurality of copy binary codes each having a plurality of bits and each code of which is representative of a different copy of said duplicated binary information, (c) assembling test groups from said copy binary codes, each of which contain one bit from each of said copy binary codes which are grouped such that like-ordered bits from said copy binary codes provide a plurality of test groups each of which should contain all "0" bits or all "1" bits, and each of which should compare with a like-ordered group of the particular coded format groups that corresponds to said available number of copies, (d) comparing said like-ordered coded format gorups and test groups, and (e) recording for display which bits of said copy binary codes are incorrect as a result of said comparison.

* * * * *

UNITED STATES PATENT AND TRADEMARK OFFICE
CERTIFICATE OF CORRECTION

PATENT NO. : 5,168,501

DATED : December 1, 1992

INVENTOR(S) : Peter B. Criswell

It is certified that error appears in the above-identified patent and that said Letters Patent is hereby corrected as shown below:

Column 10 lines 8-9, delete "said groups of binary data representative of a predetermined".

Column 10 line 14, insert -- establishing -- before "a binary".

Column 10 line 60, delete "gorups" and substitute -- groups -- .

Signed and Sealed this

Twenty-sixth Day of October, 1993

Attest:

BRUCE LEHMAN

*Attesting Officer*  *Commissioner of Patents and Trademarks*